(12) United States Patent
Riishøj et al.

(10) Patent No.: US 6,771,129 B2
(45) Date of Patent: Aug. 3, 2004

(54) BASE BIAS CURRENT CONTROL FOR AN AMPLIFIER

(75) Inventors: Jesper Riishøj, Snekkersten (DK); Peter Dam Lerke, Kastrup (DK)

(73) Assignee: Nokia Corporation, Espoo (FI)

( * ) Notice: Subject to any disclaimer, the term of this patent is extended or adjusted under 35 U.S.C. 154(b) by 10 days.

(21) Appl. No.: 10/153,868

(22) Filed: May 24, 2002

(65) Prior Publication Data

US 2002/0175762 A1 Nov. 28, 2002

Related U.S. Application Data

(60) Provisional application No. 60/293,162, filed on May 24, 2001.

(51) Int. Cl.[7] ................................................ H03G 3/30
(52) U.S. Cl. ...................................... 330/285; 330/296
(58) Field of Search ................................ 330/261, 267, 330/273, 285, 296; 455/127

(56) References Cited

U.S. PATENT DOCUMENTS

| | | | | |
|---|---|---|---|---|
| 5,436,595 A | * | 7/1995 | Wholey et al. | 330/261 |
| 5,670,912 A | * | 9/1997 | Zocher | 330/296 |
| 6,052,032 A | * | 4/2000 | Jarvinen | 330/296 |
| 6,265,943 B1 | * | 7/2001 | Dening et al. | 330/285 |

* cited by examiner

*Primary Examiner*—Khanh Van Nguyen
(74) *Attorney, Agent, or Firm*—Antonelli, Terry, Stout & Kraus, LLP

(57) ABSTRACT

An amplifier circuit includes a bias control feedback loop. A sensing transistor (105) is matched to one or more power transistors (101a, 101b, 101c) and is correspondingly biased. The difference between collector voltage of the sensing transistor (105) and a reference voltage amplified by a differential amplifier (111, 114) provides the base bias voltage for the power transistors (101a, 101b, 101c) and the sensing transistor (105). The gain of the amplifier is controlled by applying a control voltage to a resistor (110) connected to the collector of the sensing transistor (105).

20 Claims, 3 Drawing Sheets

BASE BIAS CURRENT CONTROL FOR AN AMPLIFIER

This application claims priority of U.S. Provisional Patent Application No. 60/293,162 filed on May 24, 2001.

BACKGROUND OF THE INVENTION

Field of the Invention

Description

The present invention relates to amplifiers.

It is often necessary for the gain of an amplifier to be stabilized so that the gain does not vary with environmental factors such as temperature and manufacturing tolerances.

A circuit for stabilizing the bias current of a bipolar amplifier is disclosed in EP-A-0942524. The disclosed circuit has a driver transistor which controls the base biasing currents of a plurality of power transistors, connected in series, and a control transistor via respective base resistors. A differential amplifier has one input connected to the output of a potential divider, for setting the desired bias point, and the other input connected to the collector of the control transistor. The collector of the control transistor is also connected to a regulated supply voltage via a resistor. One of the outputs of the differential amplifier is coupled to the base of the driver transistor. Any increase in the collector currents of the power transistors is reflected in the collector current of the control transistor thereby reducing the voltage fed to the second input of the differential amplifier. Consequently, the voltage applied to the base of the driver transistor is reduced and the base biasing currents of the power transistors and the control transistor are reduced. Thus, the bias currents of the power transistors are controlled by a negative feedback control loop.

It can be seen that the output of the differential amplifier cannot be usefully less than two Vbe's plus the voltage across the base resistors of the power transistors. In the case of GaAs HBT devices, Vbe is 1.2V, leaving less than 0.6V available for the output range of the differential amplifier when Vcc is 3V which is typical.

Furthermore, the prior art designs are less than ideal for Enhanced Data Rates for GSM ("EDGE") systems.

SUMMARY OF THE INVENTION

According to the present invention, there is provided an amplifier circuit comprising:

a first common emitter transistor amplifier including a base biasing resistor;

a second common emitter transistor amplifier including a base biasing resistor with bias collector current of the second common emitter transistor amplifier being substantially proportional to that of the first common emitter transistor amplifier; and a differential amplifier having one input connected to a reference voltage and a second input connected to receive the output of the second common emitter transistor amplifier, wherein the base biasing currents of the transistors of the common emitter transistors amplifiers are provided from an output of the differential amplifier which is directly coupled to the base biasing resistors of the first and second common emitter amplifiers.

The first common emitter transistor amplifier may comprise a plurality of transistors having respective base biasing resistors and sharing a common collector load impedance.

Preferably, the output of the second common emitter amplifier is taken from the junction between two series connection collector load resistors.

A bias control input may be included to provide an additional collector current path, for example via a resistor, for the second emitter follower amplifier. The bias-control input can be used to control the gain of the first emitter follower amplifier, for instance to give an output signal a desired power envelope.

An amplifier circuit according to the present invention may be employed advantageously in a mobile phone.

BRIEF DESCRIPTION OF THE DRAWINGS

An embodiment of the present invention will now be described, by way of example, with reference to the accompanying drawings:

Referring to FIG. 1, a mobile telephone comprises an antenna 1, a rf subsystem 2, a baseband DSP (digital signal processing) subsystem 3, an analog audio subsystem 4, a loudspeaker 5, a microphone 6, a controller 7, a liquid crystal display 8, a keypad 9, memory 10, a battery 11 and a power supply circuit 12.

Figure 1:
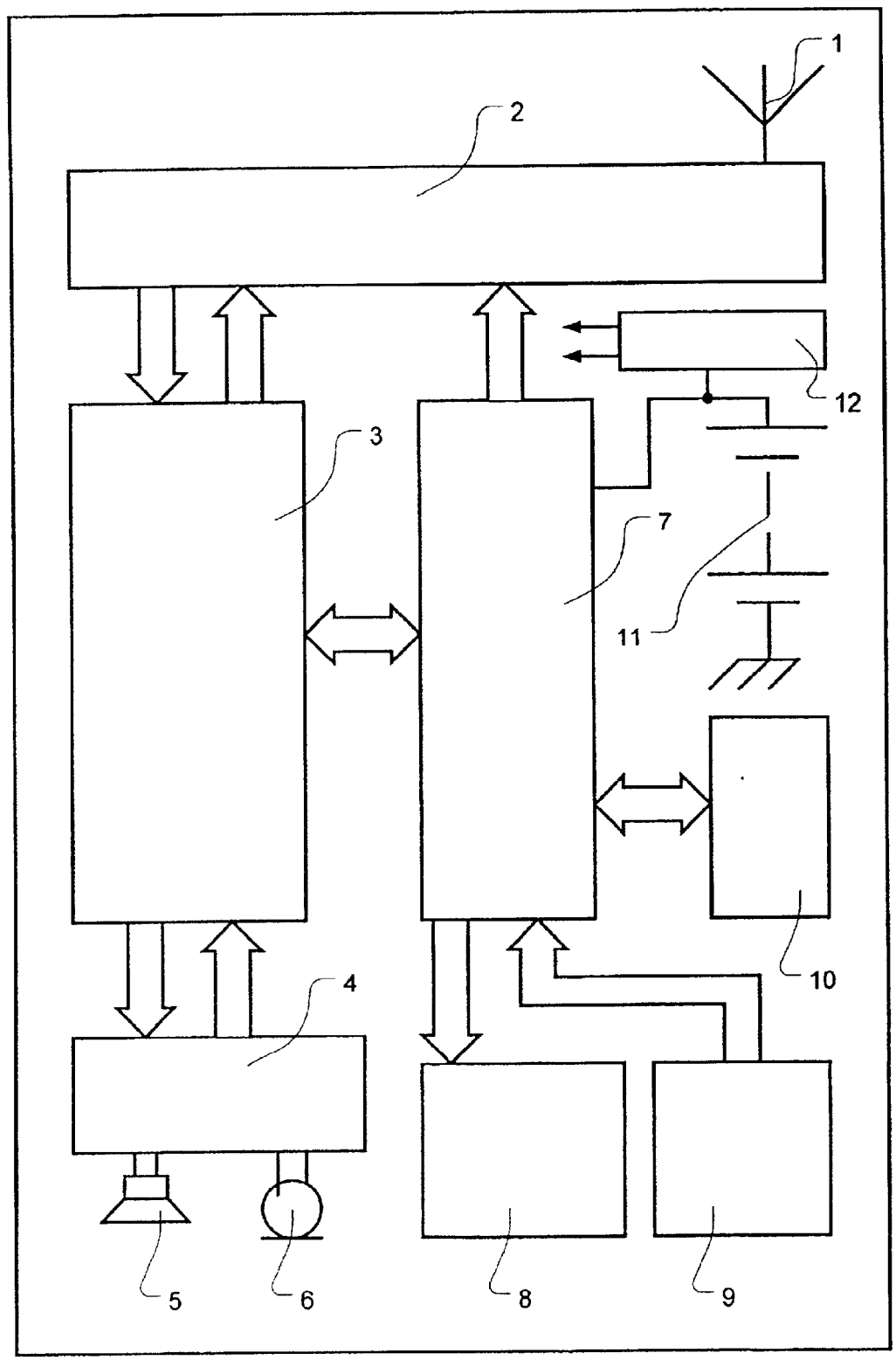
FIG. 1 is a block diagram of a mobile phone.

The rf subsystem 2 contains intermediate frequency (if) and rf circuits of the mobile telephone's transmitter and receiver and a frequency synthesizer for tuning the mobile telephone's transmitter and receiver. The antenna 1 is coupled to the rf subsystem 2 for the reception and transmission of radio waves.

The baseband DSP subsystem 3 is coupled to the rf subsystem 2 to receive baseband signals therefrom and for sending baseband modulation signals thereto. The baseband DSP subsystems 3 includes codec functions which are well-known in the art.

The analog audio subsystem 4 is coupled to the baseband DSP subsystem 3 and receives demodulated audio therefrom. The analog audio subsystem 4 amplifies the demodulated audio which is applied to the loudspeaker 5. Acoustic signals, detected by the microphone 6, are pre-amplified by the analog audio subsystem 4 and sent to the baseband DSP subsystem 4 for coding.

The controller 7 controls the operation of the mobile telephone. It is coupled to the rf subsystem 2 for supplying tuning instructions to the frequency synthesizer and to the baseband DSP subsystem for supplying control data and management data for transmission. The controller 7 operates according to a program stored in the memory 10. The memory 10 is shown separately from the controller 7. However, it may be integrated with the controller 7. A timer for triggering interrupts is also provided by the controller 7.

The display device 8 is connected to the controller 7 for receiving control data and the keypad 9 is connected to the controller 7 for supplying user input data signals thereto. Among other functions, the display device displays the estimated remaining life of the battery 11 by The battery 11 is connected to the power supply circuit 12 which provides regulated power at the various voltages used by the components of the mobile telephone. The positive terminal of the battery 11 is connected to an analog-to-digital converter (ADC) input of the controller 7.

Figure 2:
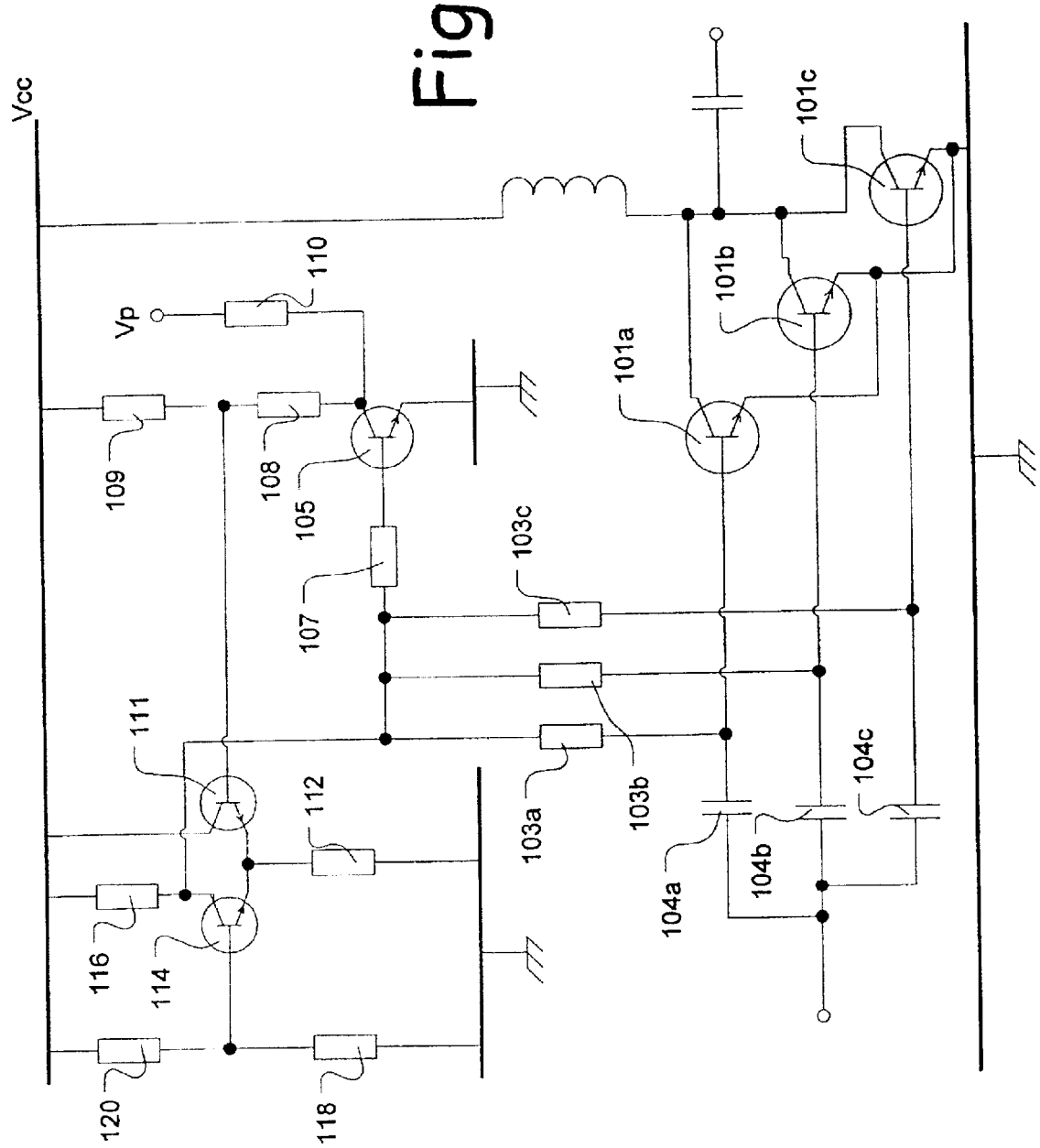
FIG. 2 is a circuit diagram of the radio frequency (rf) power amplifier of the mobile phone of FIG. 1.

Referring to FIG. 2, the rf power amplifier of the rf subsystem 2 of FIG. 1 includes a plurality of npn power transistors 101a, 101b, 101c, having respective base biasing resistors 103a, 103b, 103c and input capacitors 104a, 104b, 104c connecting the bases of the power transistors 101a, 101b, 101c with a rf input. A control transistor 105, matched to the power transistors 101a, 101b, 101c, has a base bias resistor 107. The control transistor 105 is matched to the power transistors 101a, 101b, 101c such that the bias current of the control transistor 105 is proportional to the bias currents of the power transistors 101a, 101, 101c. Also, the control transistor 105 should be positioned so that it experiences the same environmental conditions as the power transistors 101a, 101b, 101c.

The collector of the control transistor 105 is connected to a regulated supply voltage Vcc via first and second series connected resistors 108, 109. The collector of the control transistor 105 is also connected to a control input Vp via a third resistor 110.

The junction between the first and second resistors 108, 109 is coupled to the base of a first transistor 111 of a differential pair of transistors. The first transistor 111 of the differential pair has its collector connected directly to the regulated supply voltage Vcc and its emitter connected to ground via a fourth resistor 112. The second transistor 114 of the differential pair has its emitter connected to the emitter of the first transistor 110 and its collector connected to the regulated supply voltage Vcc via a fifth resistor 116. The collector of the second transistor 114 is also connected to the base bias resistors bO3a, 103b, 103c, 107 of the power transistors 101a, 101b, 101c and the control transistor 105. The base of the second transistor 114 is connected to the junction between sixth and seventh resistors 118, 120 which form a potential divider between the regulated supply voltage Vcc and ground.

Ignoring for the moment the effect of the control input Vp, the bias currents of the power transistors 101a, 101b, 101c and the control transistor 105 is set by the first potential divider, comprising the sixth and seventh resistors 118, 120, and the voltage fed back from the second potential divider, comprising the first and second resistors 108, 109, to the first transistor 111.

If the bias currents following through the power transistors 101a, 101b, 101c increase, for example due to a temperature increase, a corresponding increase occurs in the bias current flowing through the control transistor 105. This lowers the voltage on the base of the first transistor ill increasing the collector current of the second transistor 114. The increased collector current through the second transistor 114 leads to a reduction in its collector voltage and, consequently, a reduction in the base bias currents of the power transistors 101a, 101b, 111c and the control transistor 105.

Conversely, it can be seen that a decrease in the dc collector currents of the power transistors 101a, 101b, 101c and the control transistor 105 will result in an increase in the collector voltage of the second transistor 114 and an increase in the base bias currents of the power transistors 101a, 101b, 101c and the control transistor 105.

Figure 3:
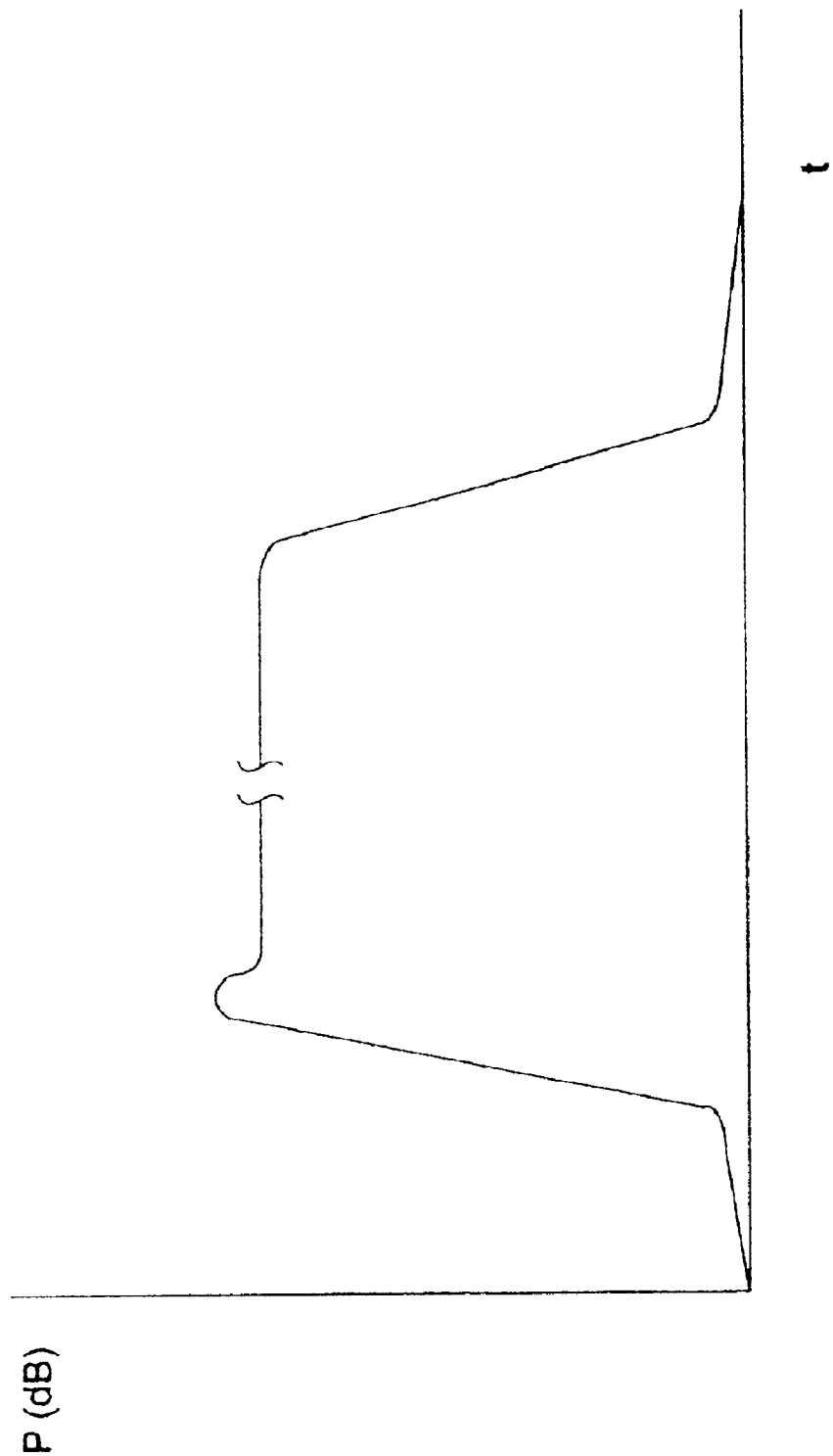
FIG. 3 shows the power profile of a burst produced by the mobile phone of FIG. 1 and the corresponding power amplifier control signal.

Referring to FIG. 3, for each burst transmitted by the mobile phone, the power level is ramped up over a predetermined number of symbol periods to a desired maximum and ramped down at the end of the burst. This ramping reduces the generation of harmonics at the beginning and end of each burst to acceptable levels. The power ramping and maximum power level are controlled by Vp.

As Vp increases, the voltage on the base of the first transistor 111 increases, leading to an increase in the collector voltage of the second transistor 114 and a corresponding increase in the bias currents of the power transistors 101a, 101b, 110c and the control transistor 105.

While Vp remains constant, the bias currents of the power transistors 101a, 101b, 101c are stabilized by the process described above.

At the end of a burst, Vp ramps down and the voltage on the base of the first transistor III is decreased causing a ramping down of the bias currents of the power transistors 101a, 101b, 101c.

What is claimed is:

1. An amplifier circuit comprising:
a first common emitter transistor amplifier including a base biasing resistor;
a second common emitter transistor amplifier including a base biasing resistor with bias collector current being substantially proportional to bias collector current of the first common emitter transistor amplifier; and
a differential amplifier comprising a differential pair of transistors respectively having inputs with a first input of the differential pair being connected to a reference voltage and a second input of the differential pair being connected to receive the output of the second common emitter transistor amplifier; and
wherein base biasing currents of the transistors of the common emitter transistor amplifiers are provided from an output of the differential pair which is directly coupled to the base biasing resistors of the first and second common emitter amplifiers.

2. An amplifier circuit according to claim 1, wherein the first common emitter transistor amplifier comprises a plurality of transistors having respective base biasing resistors and sharing a common collector load impedance.

3. An amplifier circuit according to claim 1, wherein the output of the second common emitter amplifier is taken from the junction between two series connected collector load resistors.

4. An amplifier circuit according to claim 1, including a bias control input providing an additional collector current path for the second emitter follower amplifier.

5. An amplifier circuit according to claim 2, including a bias control input providing an additional collector current path for the second emitter follower amplifier.

6. An amplifier circuit according to claim 3, including a bias control input providing an additional collector current path for the second emitter follower amplifier.

7. An amplifier circuit according to claim 4, wherein the additional collector current path includes a resistor.

8. An amplifier circuit according to claim 5, wherein the additional collector current path includes a resistor.

9. An amplifier circuit according to claim 6, wherein the additional collector current path includes a resistor.

10. A mobile phone including an amplifier circuit according to claim 1.

11. A mobile phone including an amplifier circuit according to claim 2.

12. A mobile phone including an amplifier circuit according to claim 3.

13. A mobile phone including an amplifier circuit according to claim 4.

14. A mobile phone including an amplifier circuit according to claim 5.

15. A mobile phone including an amplifier circuit according to claim 6.

16. A mobile phone including an amplifier circuit comprising:

a first common emitter transistor amplifier including a base biasing resistor;

a second common emitter transistor amplifier including a base biasing resistor with bias collector current being substantially proportional to that of the first common emitter transistor amplifier; and a differential pair of transistors having one input connected to a reference voltage and a second input connected to receive the output of the second common emitter transistor amplifier; and wherein base biasing currents of the transistors of the common emitter transistor amplifiers are provided from an output of the differential pair of transistors which is directly coupled to the base biasing resistors of the first and second common emitter amplifiers.

17. A mobile phone according to claim 16, wherein the first common emitter transistor amplifier comprises a plurality of transistors having respective base biasing resistors and sharing a common collector load impedance.

18. A mobile phone according to claim 16, wherein the output of the second common emitter amplifier is taken from a junction between two series connected collector load resistors.

19. A mobile phone according to claim 16, including a bias control input providing an additional collector current path for the second emitter follower amplifier.

20. A mobile phone according to claim 19, wherein the additional collector current path includes a resistor.

* * * * *